United States Patent
Kang

(10) Patent No.: US 7,505,343 B2
(45) Date of Patent: Mar. 17, 2009

(54) SENSE AMPLIFIER CIRCUIT IN SEMICONDUCTOR MEMORY DEVICE AND DRIVING METHOD THEREOF

(75) Inventor: Hee Bok Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 140 days.

(21) Appl. No.: 11/677,623

(22) Filed: Feb. 22, 2007

(65) Prior Publication Data
US 2007/0201290 A1     Aug. 30, 2007

(30) Foreign Application Priority Data
Feb. 22, 2006    (KR) .................... 10-2006-0016987

(51) Int. Cl.
*G11C 7/00*    (2006.01)
(52) U.S. Cl. ........................ 365/205; 365/207
(58) Field of Classification Search ............. 365/205, 365/207, 203
See application file for complete search history.

(56) References Cited

U.S. PATENT DOCUMENTS 5,544,110 A * 8/1996 Yuh ........................ 365/205
5,982,690 A * 11/1999 Austin ..................... 365/205
5,995,432 A * 11/1999 Nagata et al. ............. 365/205
6,633,188 B1 * 10/2003 Jia et al. .................. 327/217

* cited by examiner

*Primary Examiner*—Anh Phung
(74) *Attorney, Agent, or Firm*—Ladas & Parry LLP

(57) ABSTRACT

Provided is a sense amplifier circuit in a semiconductor memory device in which an under-drive is applied to a switching element of a pull-down side of a sense amplifier in order to compensate for poor driving capability in the case of performing a low voltage operation. The sense amplifier circuit includes: a sense amplifier which has a pull-down element composed of an NMOS transistor and a pull-up element composed of a PMOS transistor and is formed between bit lines to perform data exchange; and a drive controller which supplies a drive voltage for the use of pull-up and pull-down operations to the sense amplifier in order to perform the data exchange, and, during a specific time period included in a time for providing the drive voltage, performs an under-drive whereby the drive voltage for the use of the pull-down operation is used so that the sense amplifier is provided with a voltage that is lower than a voltage used in the pull-down operation in a normal state.

32 Claims, 8 Drawing Sheets

SENSE AMPLIFIER CIRCUIT IN SEMICONDUCTOR MEMORY DEVICE AND DRIVING METHOD THEREOF

TECHNICAL FIELD

The present invention relates to a sense amplifier circuit in a semiconductor memory device, and more particularly, to a sense amplifier circuit in a semiconductor memory device in which an under-drive is applied to a switching element of a pull-down side of a sense amplifier in order to compensate for poor driving capability in the case of performing a low voltage operation.

BACKGROUND ART

In general, as a low voltage is gradually applied for an operation of a semiconductor memory device, an operation voltage margin for a threshold voltage of an NMOS transistor or a PMOS transistor becomes insufficient. As a result, an operation feature of a sensor amplifier deteriorates.

The sense amplifier includes an NMOS transistor for a pull-down operation and a PMOS transistor for a pull-up operation. There are significant changes in an average value of threshold values of the NMOS transistor and the PMOS transistor constituting the sense amplifier. The different between PMOS transistors for the pull-up operation is greater than that of NMOS transistors for the pull-down operation. Therefore, an offset voltage of a PMOS amplifier is significantly larger than that of an NMOS amplifier.

In the case of a low voltage operation, driving capability of an amplifier deteriorates. For this reason, the aforementioned phenomenon takes an important role in the determination of an operation feature.

Referring to FIGS. 1a and 1b, the X-axis of FIG. 1b is associated with threshold voltages of a right NMOS transistor and a right PMOS transistor shown in FIG. 1a. Further, the Y-axis of FIG. 1b is associated with threshold voltage of a left NMOS transistor and a left PMOS transistor shown in FIG. 1a. To obtained the view of FIG. 1b, the threshold voltages of the respective NMOS transistors and PMOS transistors included in a plurality of sense amplifiers are measured and are respectively mapped into the coordinates.

Referring to the figures, in the case of NMOS transistors, the threshold voltage features of the left NMOS transistor and the right NMOS transistor are uniformly distributed. On the other hand, in the case of PMOS transistors, the threshold voltage features the left PMOS transistor and the right PMOS transistor are dispersed, thereby showing non-uniform distribution.

A conventional sense amplifier S/A is provided for a cell array as shown in FIG. 2. FIG. 2 illustrates an example of a folded bit line structure.

A cell is composed of one NMOS transistor controlled by a word line WLn and one capacitor. The drain of the NMOS transistor is connected to a bit line. The source of the NMOS transistor is connected to one electrode of the capacitor, wherein its connection point is defined as a storage node SN at which writing charges are stored. The other electrode of the capacitor is a plate electrode PL. The plate electrode PL is connected to a common cell plate and is supplied with a cell plate voltage. The cell plate voltage is generally VDD/2, where VDD is defined as a high operation voltage of the cell.

Bit lines BL and /BL are connected to the sense amplifier S/A. When the word line WL0 is activated and thus cell data is delivered to the bit line BL, the bit line /BL provides a reference voltage. On the contrary, when the word line WL1 is activated and thus the cell data is delivered to the bit line /BL, the bit line BL provides the reference voltage. In a data buffer and the sense amplifier S/A, data is input and output through local data buses LDB and LDBB.

FIG. 3 is a circuit diagram of a latch type sense amplifier.

A pull-up activation stage of the latch type sense amplifier is controlled in response to a control signal SAP. A pull-down activation stage of the latch type sense amplifier is controlled in response to a control signal SAN.

For a pre-charge operation, a bit line pre-charge voltage VBLP is supplied to the bit lines BL and /BL by using an equalizing signal BLEQ. Here, the bit line pre-charge voltage VBLP may be defined as VDD/2.

A column selection signal YI is used to select the sense amplifier in order to exchange data between bit lines BL and /BL and local data buses LDB and LDBB. Bit line selection signals BISH and BISL are used to exchange data through the bit lines BL and /BL between the sense amplifier and the cell array.

An equalizing signal BLEQ is used to equalize a voltage between the bit lines BL and /BL.

The circuits of FIGS. 2 and 3 operate in the same manner as a circuit of FIG. 4. Specifically, in a pre-charge period, the bit lines BL and /BL and the control signals SAN and SAP are pre-charged to the bit line pre-charge voltage VBLP.

In a charge share period that comes after the pre-charge period, the word line WL is activated, and as a result, cell data is loaded on the bit line BL.

Thereafter, in a sense amplify period, to amplify signals of the bit lines BL and /BL, the control signal SAN transits to a ground voltage, and the control signal SAP transits to the voltage VDD. Therefore, the bit lines BL and /BL are amplified to a cell high voltage level and a ground level.

Subsequently, a restore operation is carried out. In this period, the amplified signal of the bit line /BL is rewritten in a cell.

When the restore operation is completed, the bit lines BL and /BL are restored to a pre-charge state.

Regarding the operation voltage of the semiconductor memory device operated in the aforementioned manner, as described above, the operation voltage margin for the threshold voltages of the NMOS transistor and the PMOS transistor included in the sense amplifier becomes insufficient. As a result, the operation feature of the sense amplified deteriorates.

In particular, the difference of the threshold voltage between both sides of PMOS transistors of the sense amplifier is much greater than that of NMOS transistors of the sense amplifier. Therefore, in the case of a low voltage operation, amplification driving capability of the sense amplifier decreases.

In order to solve these problems, the conventional semiconductor memory device employs an over-drive method so as to improve PMOS driving capability.

However, since a PMOS offset feature has a significant effect on the over-drive method, erroneous data may be output from the sense amplifier.

DISCLOSURE OF THE INVENTION

In order to solve the aforementioned problems, the present invention improves driving capability of a sense amplifier by performing an under-drive at a drive time point.

The present invention also prevents erroneous data that is produced by an over-drive from being output from the sense amplifier by concurrently performing the under-drive and the over-drive.

The present invention also increases a speed when data is read from or written in a cell by enhancing driving capability of the sense amplifier.

According to an aspect of the present invention, there is provided a sense amplifier circuit in a semiconductor memory drive, comprising: a sense amplifier which has a pull-down element composed of an NMOS transistor and a pull-up element composed of a PMOS transistor and is formed between bit lines to perform data exchange; and a drive controller which supplies a drive voltage for the use of pull-up and pull-down operations to the sense amplifier in order to perform the data exchange, and, during a specific time period included in a time for providing the drive voltage, performs an under-drive whereby the drive voltage for the use of the pull-down operation is used so that the sense amplifier is provided with a voltage that is lower than a voltage used in the pull-down operation in a normal state.

In the aforementioned aspect of the present invention, the drive controller may perform the under-drive after the sense amplifier is connected to the bit lines.

In addition, for the under-drive, the drive controller may provide a voltage selected from the group consisting of a voltage lower than a ground voltage, a negative voltage, and a voltage lower than a ground voltage and higher than −5V.

In addition, during another specific time period included in the time for providing the drive voltage, the drive controller may perform an over-drive whereby the drive voltage for the use of the pull-up operation is used so that the sense amplifier is provided with a voltage that is higher than a voltage used in the pull-up operation in the normal state. Further, the drive controller may provide a voltage equal to or higher than a chip supply voltage VDD in order to perform the over-drive.

In addition, the drive controller may perform the over-drive after the under-drive is performed. Further, the drive controller may concurrently perform the under-drive and the over-drive for a specific time period.

In addition, the drive controller may further comprise: a normal pull-up driver which supplies a normal pull-up voltage to the sense amplifier in response to a normal pull-up control signal; a normal pull-down driver which supplies a normal pull-down voltage to the sense amplifier in response to a normal pull-down control signal; and an under-driver which supplies a voltage lower than the normal pull-down voltage to the sense amplifier in response to an under-drive control signal.

In addition, the sense amplifier circuit may further comprise an over-driver which supplies a voltage higher than the normal pull-up voltage to the sense amplifier in response to an over-drive control signal.

According to another aspect of the present invention, there is provided a sense amplifier circuit in a semiconductor memory device, comprising: bit lines connected to a cell; a sense amplifier which has a pull-down element composed of an NMOS transistor and a pull-up element composed of a PMOS transistor and is formed between the bit lines to perform data exchange; a bit line selector which determines the connection between the sense amplifier and the bit lines in order to perform the data exchange; and a drive controller which supplies a drive voltage for the use of pull-up and pull-down operations to the sense amplifier in order to perform the data exchange, and, during a specific time period included in a time for providing the drive voltage, performs an under-drive in which the drive voltage for the use of the pull-down operation is used so that the sense amplifier is provided with a voltage that is lower than a voltage used in the pull-down operation in a normal state.

According to still another aspect of the present invention, there is provided a driving method of a sense amplifier circuit in a semiconductor memory device, comprising: a first step of connecting bit lines and a sense amplifier after the bit lines are pre-charged; a second step of performing an under-drive by supplying a voltage which is lower than a voltage used in the pull-down operation in a normal state to a pull-down drive stage of an NMOS transistor included in the sense amplifier; a third step of performing an over-drive by supplying a voltage which is higher than a voltage used in the pull-up operation in the normal state to a pull-up drive stage of a PMOS transistor included in the sense amplifier after the under-drive is initially performed; a fourth step of performing a pull-down operation by supplying the voltage used in the pull-down operation in the normal state to the pull-down drive stage of the NMOS transistor included in the sense amplifier after the under-drive is completed; and a fifth step of performing a pull-up operation by supplying the voltage used in the pull-up operation in the normal state to the pull-up drive stage of the PMOS transistor included in the sense amplifier after the over-drive is completed.

In the aforementioned aspect of the present invention, the under-drive may be performed at a voltage selected from the group consisting of a voltage lower than a ground voltage, a negative voltage, and a voltage lower than a ground voltage and higher than −5V.

In addition, the over-drive may be performed at a voltage equal to or higher than a chip supply voltage VDD.

In addition, the under-drive and the over-drive may be concurrently performed for a specific time period, or may be performed before the over-drive is completed, or may be completed before the pull-up operation is initially performed in the normal state.

BRIEF DESCRIPTION OF THE DRAWINGS

FIG. 1b is a view for explaining a threshold voltage offset feature of the sense amplifier of FIG. 1a.

BEST MODE FOR CARRYING OUT THE INVENTION

Hereinafter, exemplary embodiments of the present invention will be described in detail with reference to the accompanying drawings.

Figure 1A:
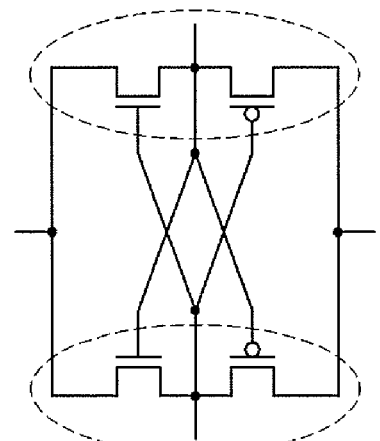
FIG. 1a is a circuit diagram of a general sense amplifier.
Figure 1B:
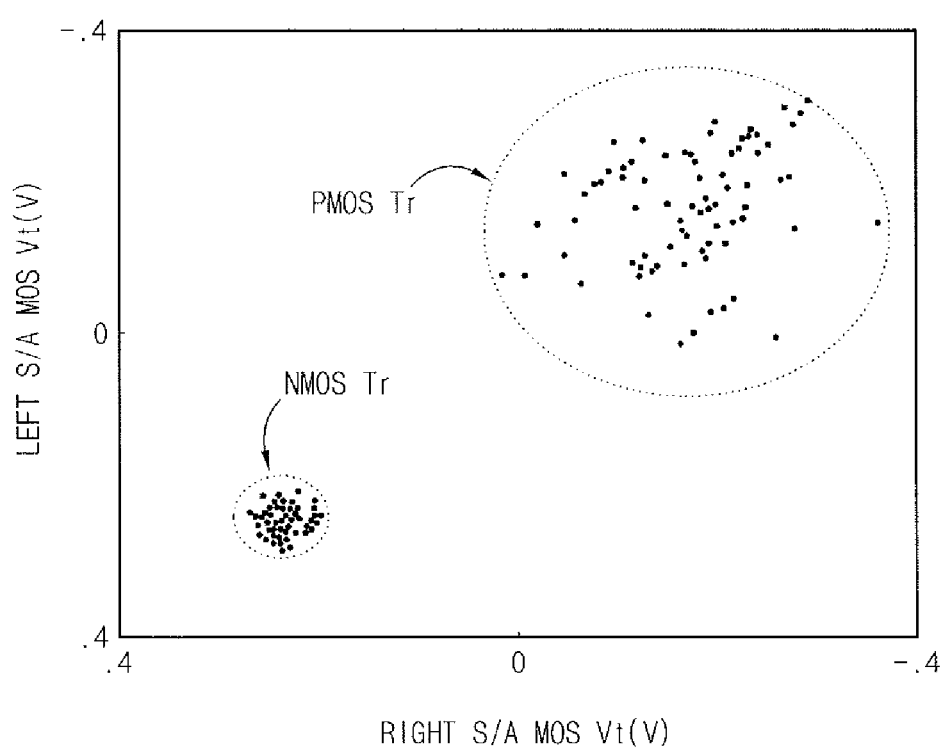
Figure 2:
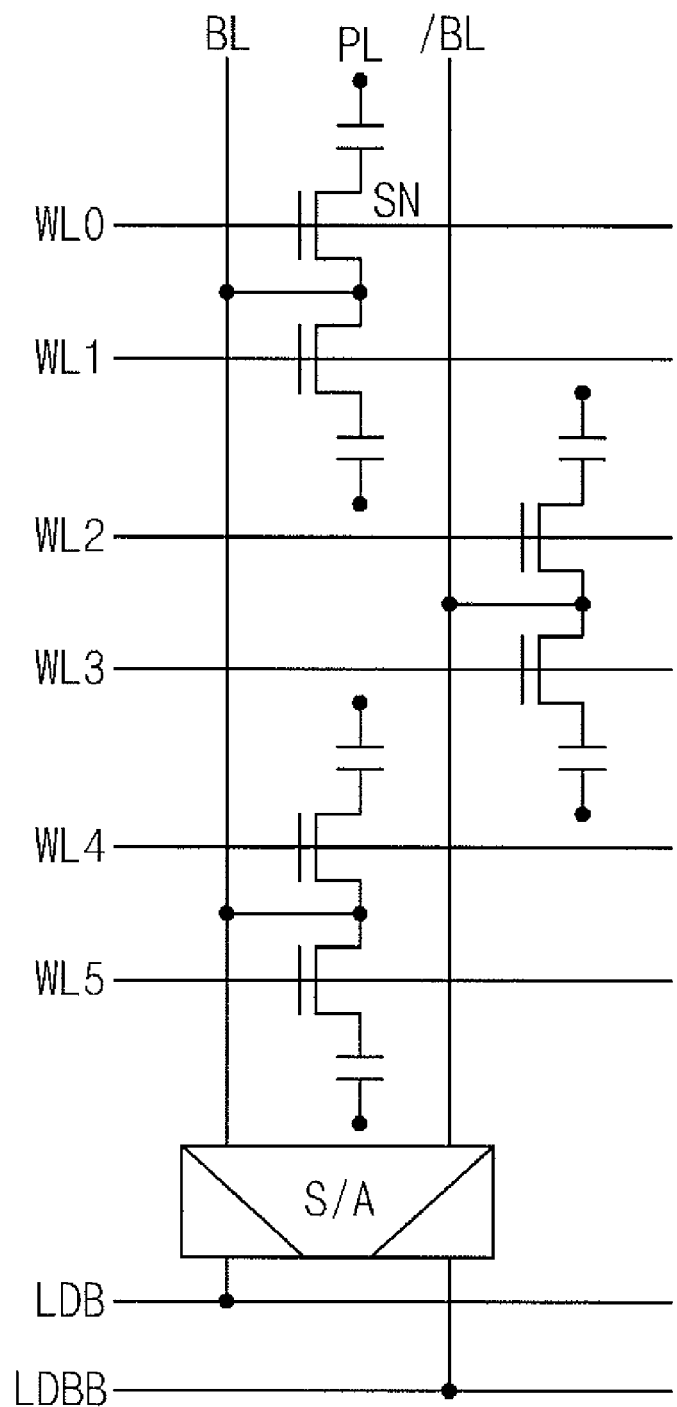
FIG. 2 is a circuit diagram of a memory cell array having a folded bit line structure in association with a sensing operation.
Figure 3:
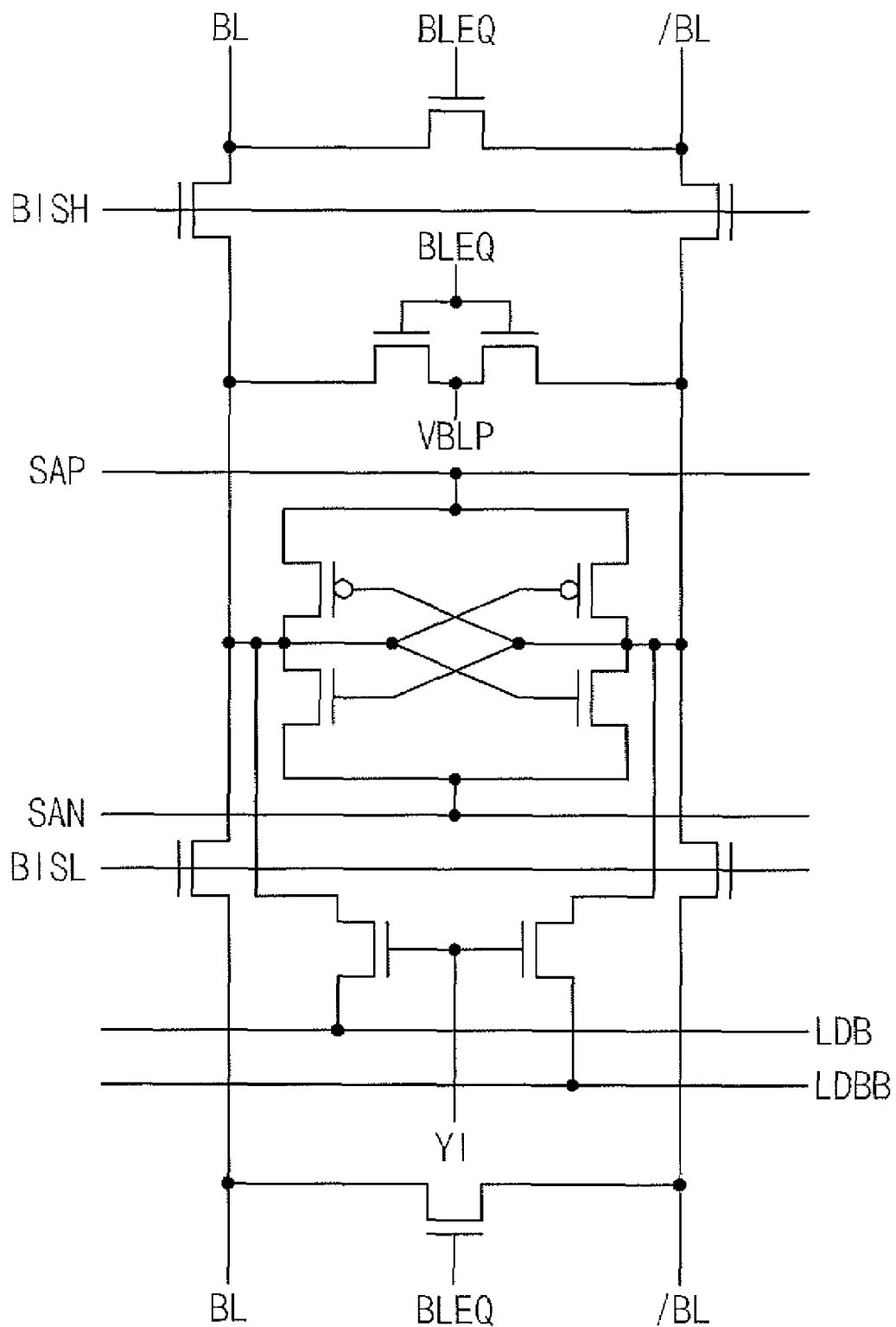
FIG. 3 is a circuit diagram of a sense amplifier used in a general folded bit line structure.
Figure 4:
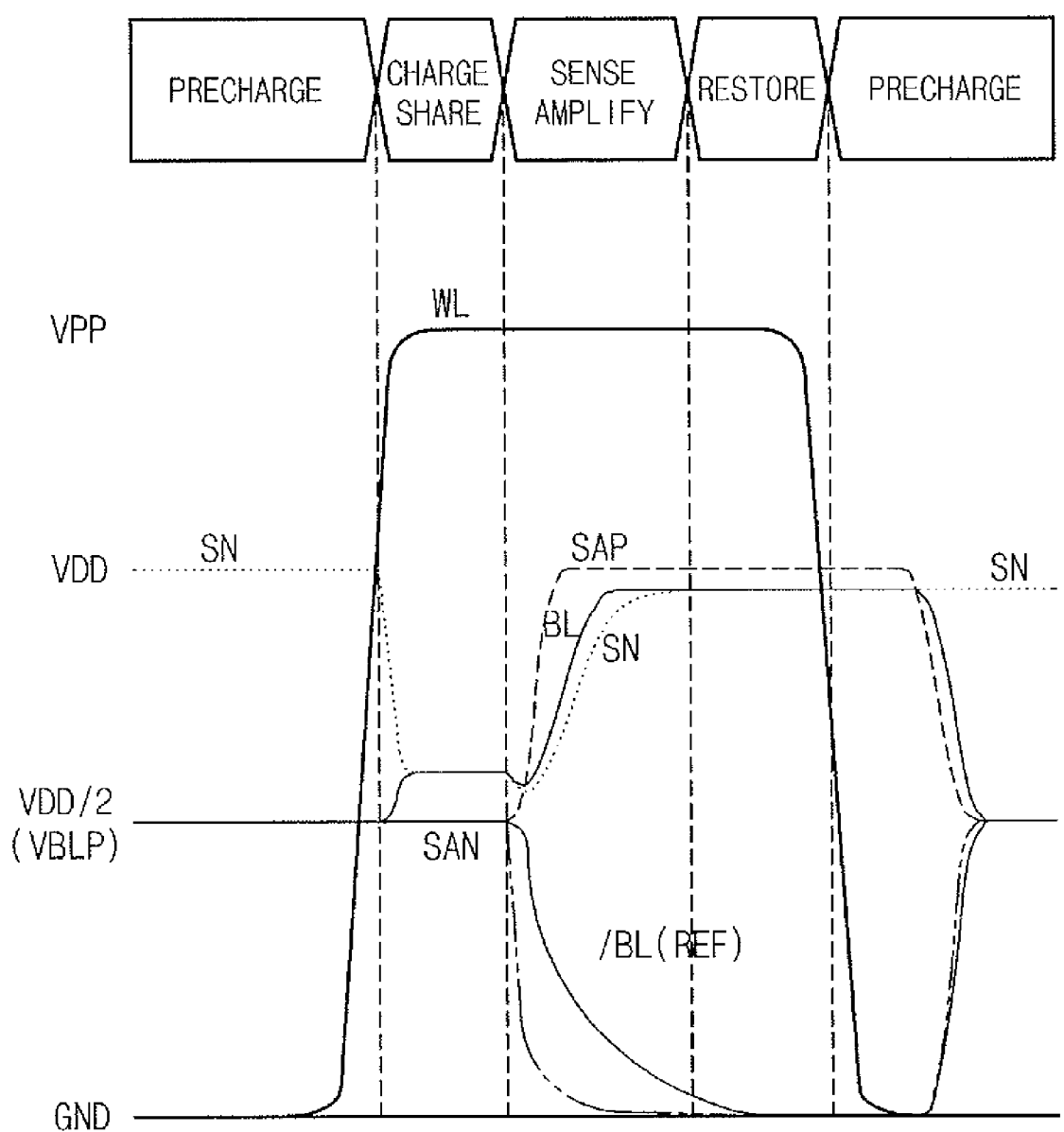
FIG. 4 is a timing diagram for explaining cell array driving and sensing operations.
Figure 5:
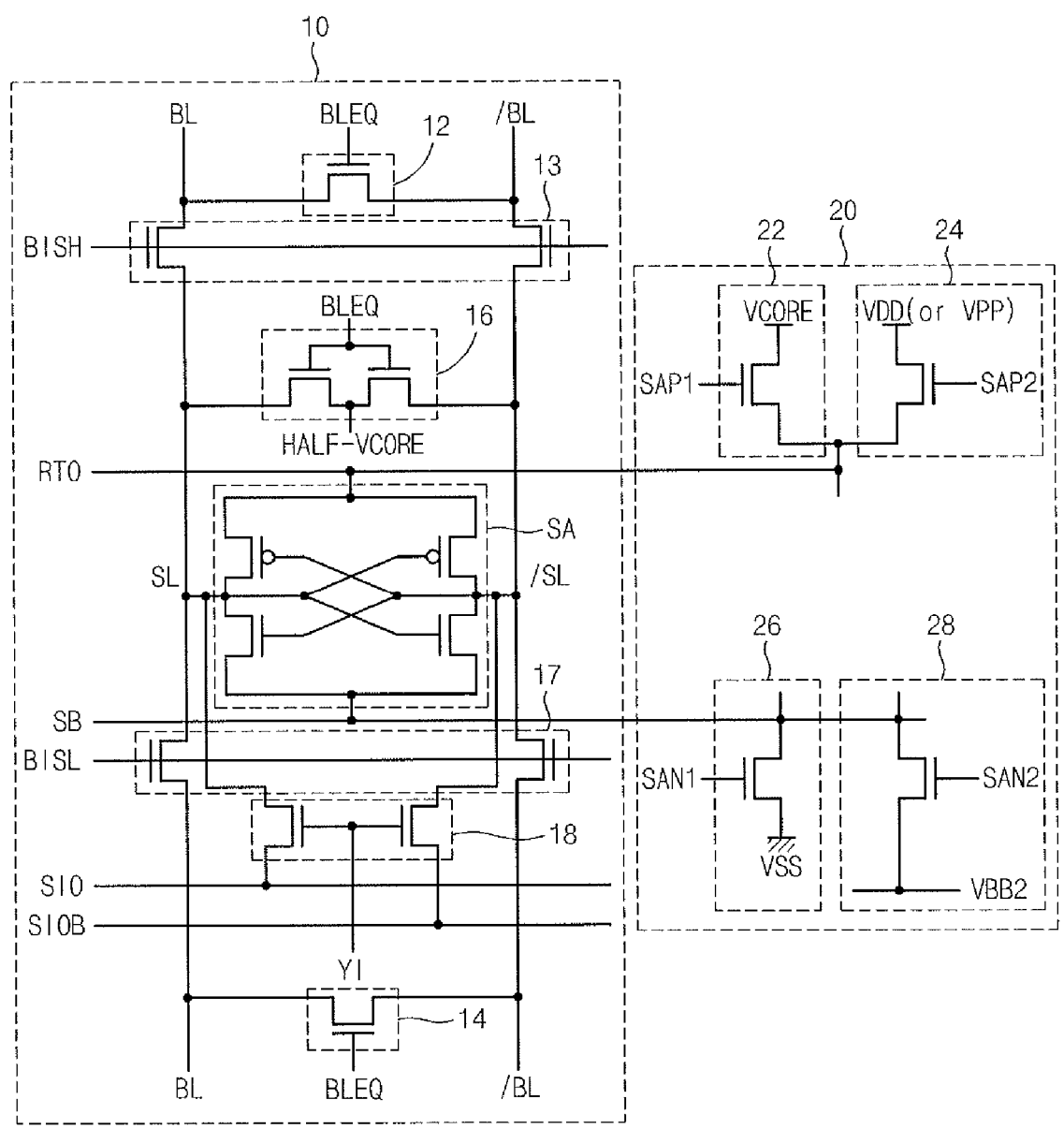
FIG. 5 is a circuit diagram of a folded bit line structure employed by a sense amplifier circuit in a semiconductor memory device according to an embodiment of the present invention.

FIG. 5 is a circuit diagram of a folded bit line structure employed by a sense amplifier circuit in a semiconductor memory device according to an embodiment of the present invention. A sense amplifier 10 is formed between bit lines BL and /BL. A drive controller 20 is formed to supply a pull-up voltage and a pull-down voltage to a sense amplifier SA of the sense amplifier 10.

A pair of equalizers 12 and 14, a pre-charger 16, and the sense amplifier SA are formed in parallel between the bit lines BL and /BL. The pre-charger 16 and the sense amplifier SA are formed between the pair of equalizers 12 and 14. A bit line selector 13 is formed over the bit lines BL and /BL between the equalizer 12 and the pre-charger 16. Another bit line selector 17 is formed over the bit line BL and /BL between the equalizer 14 and the sense amplifier SA.

Input/output stages connected to the bit lines BL and /BL of the sense amplifier SA are respectively connected to input/output lines SIO and SIOB via a selector 18.

The drive controller 20 includes a normal pull-up driver 22, an over-driver 24, a normal pull-down driver 26, and an under-driver 28. The normal pull-up driver 22 and the over-driver 24 are supplied with different voltages (i.e., a core voltage VCORE and a high voltage VDD or VPP) and are commonly connected to a pull-up voltage supply stage RTO of the sense amplifier SA. The normal pull-down driver 22 and the under-driver 24 are supplied with different voltages (e.g., a ground voltage VSS and a back bias voltage VBB2) and are commonly connected to a pull-down voltage supply stage SB of the sense amplifier SA.

The sense amplifier SA having the aforementioned structure allows the bit lines BL and /BL to be supplied with a voltage of VCOER/2 in response to an equalizing signal BLEQ for a pre-charge operation.

Data is input and output between the sense amplifier SA and the input/output lines SIO and SIOB in response to a column selection signal YI.

Data is exchanged through the bit lines BL and /BL between the sense amplifier SA and a cell array in response to bit line selection signals BISH and BISL.

To achieve equalization between the bit lines BL and /BL, the equalizer 12 operates in response to the equalizing signal BLEQ.

In the drive controller 20, the pull-up driver 22 includes an NMOS transistor which provides the voltage VCORE that is a bit line high voltage for the use of a pull-up operation of the sense amplifier SA. The pull-up driver 22 is driven in response to a normal pull-up control signal SAP1. The over-driver 24 includes an NMOS transistor which provides the high voltage VPP equal to or higher than the chip supply voltage VDD for the use of the pull-up operation of the sense amplifier SA. For an over-drive, the over-driver 24 is driven in response to an over-drive control signal SAP2. The normal pull-down driver 26 includes an NMOS transistor which provides the ground voltage VSS to the bit lines. The normal pull-down driver 26 is driven in response to a normal pull-down control signal SAN1. For an under-drive, the under-driver 28 includes an NMOS transistor which provides the back bias voltage VBB2 that is a negative voltage. The under-driver 28 is driven in response to an under-drive control signal SAN2.

Figure 6:
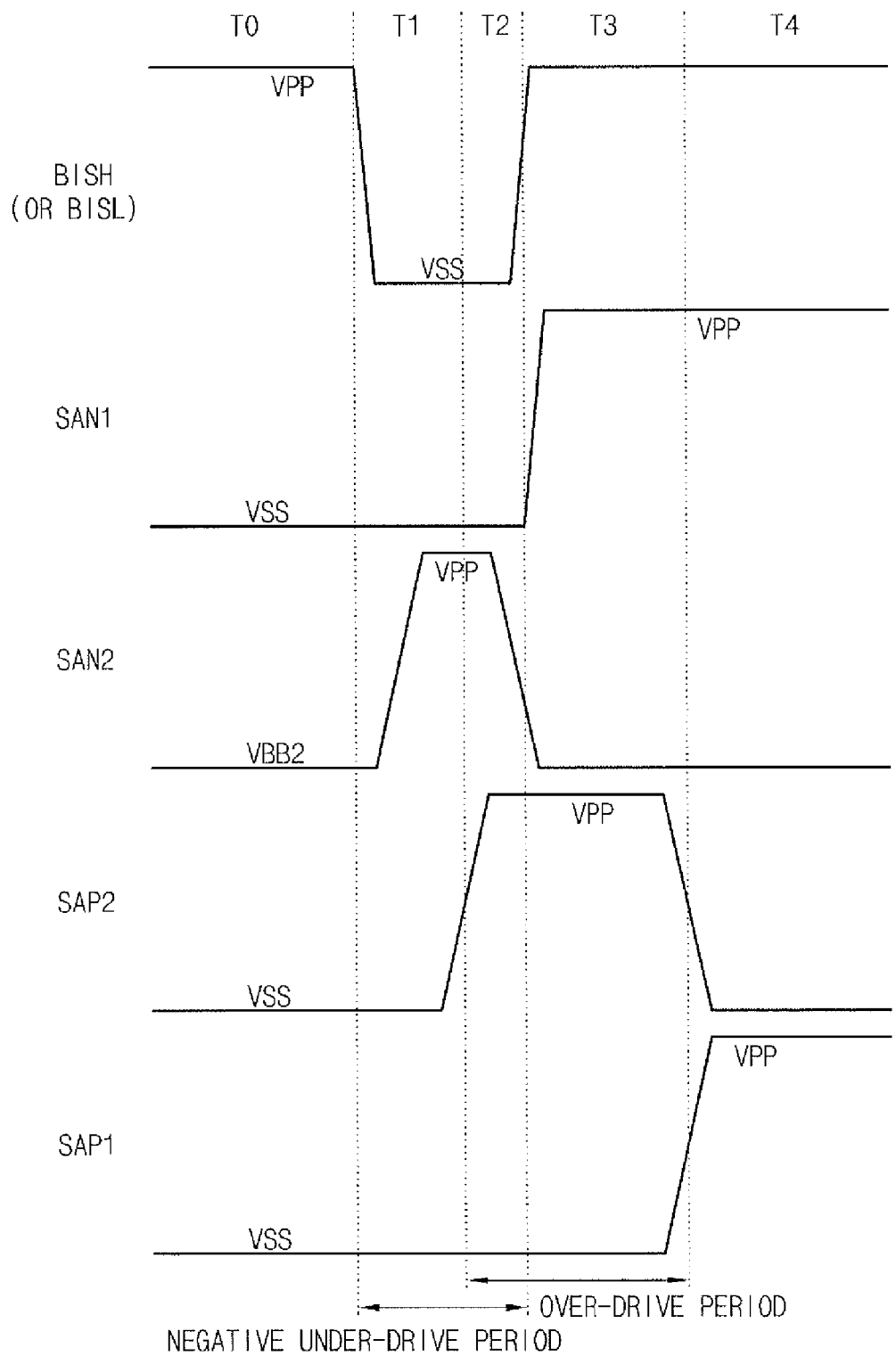
FIG. 6 is a timing diagram of an operation of the circuit of FIG. 5.

FIG. 6 is a circuit diagram of a sense amplifier circuit according to the aforementioned embodiment used in the folded bit line structure.

In a pre-charge period, the bit lines BL and /BL and the pull-up and pull-down drive stages RTO and SB of the sense amplifier SA are pre-charged to a voltage of VCORE/2.

In this state, when a period T0 starts, a word line of a cell is activated, and as a result, cell data is loaded on the bit line BL. The bit line selection signal BLSH or BLSL is high in this state, and thus the bit line selector 13 in the cell side is in an open state.

Thereafter, in a period T1, the bit line selection signal BLSH transits from high to low, thereby deactivating a bit line switching state. Then, the bit lines BL and /BL are separated from the input/output stages SL and /SL of the sense amplifier SA. The deactivation state of the bit line selection signal is maintained until a next period T2 starts.

In the period T1, the under-drive control signal SAN2 is activated. Then, the under-driver 28 is driven so that the pull-down drive stage SB of the sense amplifier SA transits to a negative voltage, that is, the under-drive voltage VBB2, and its state is maintained until the period T2 starts.

The under-drive control signal SAN2 is activated during the periods T1 through T2. Accordingly, the pull-down drive stage SB of the sense amplifier SA is maintained to the negative voltage, that is, the under-drive voltage VBB2. This period is defined as a negative under-driver period.

In the period T2, the over-drive control signal SAP2 is activated. Then, the over-driver 28 is driven so that the pull-up drive stage RTO of the sense amplifier SA transits to the high voltage VPP, and this state is maintained until a period T3 starts.

The over-drive control signal SAP2 is activated during the periods T2 through T3. Accordingly, the pull-up drive stage RTP of the sense amplifier SA is maintained to the high voltage VPP. This period is defined as an over-drive period. Cell data is amplified in the over-drive period.

In the period T3, the under-drive control signal SAN2 is deactivated, and the normal pull-down control signal SAN1 and the bit line selection signal BISH are activated.

When the bit line section signal BISH is reactivated, an amplification signal of the sense amplifier SA is delivered from the output stages SL and /SL to the bit lines BL and /BL.

Thereafter, in a period T4, the over-drive control signal SAP2 transits to low, thereby stopping the over-drive of the bit lines.

In addition, in the period T4, the normal pull-up control signal SAP1 transits to high so that a voltage provided to the sense amplifier SA for the use of a pull-up operation is modified from the high voltage VPP to the core voltage VCORE.

Figure 7:
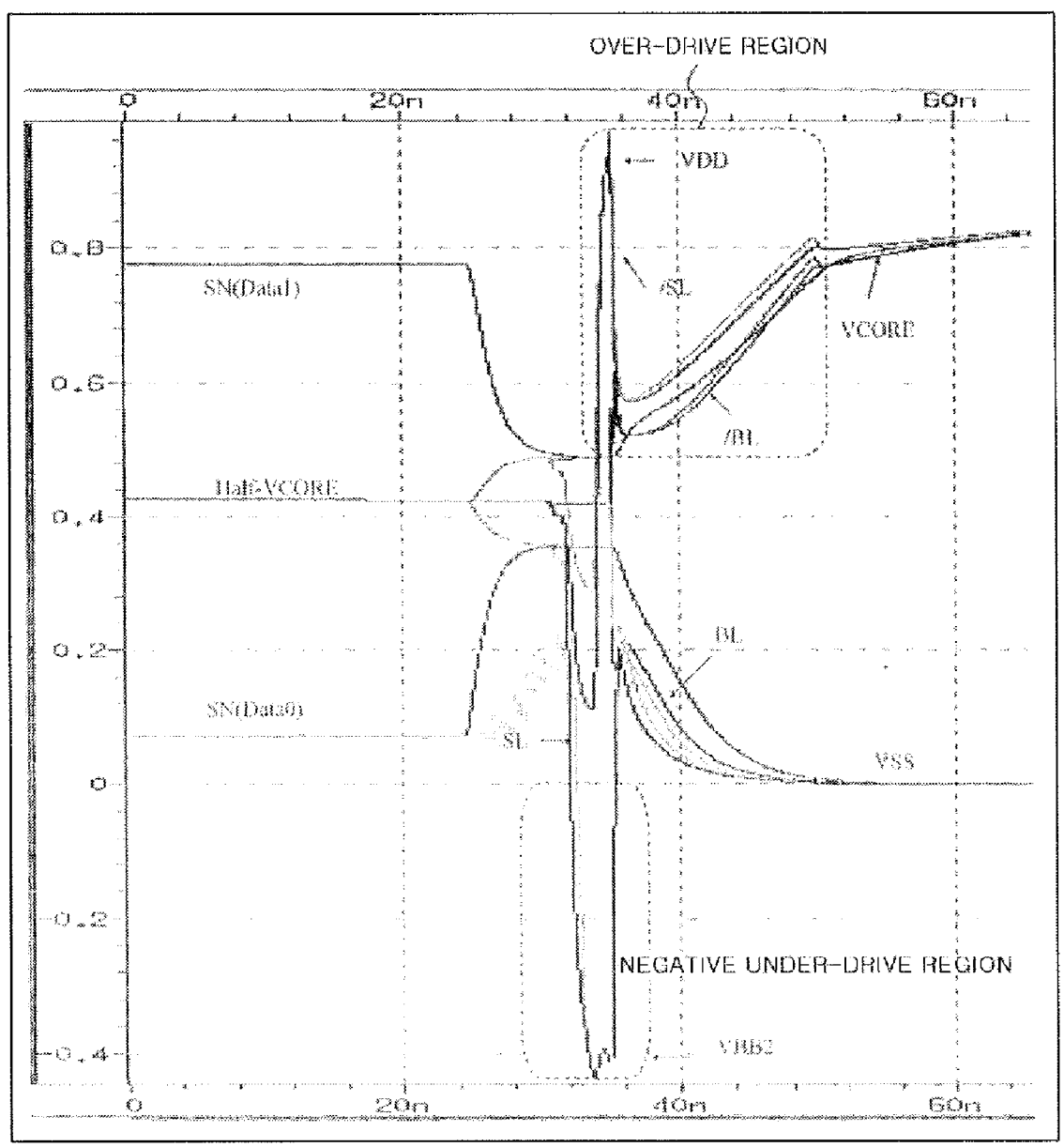
FIG. 7 is a waveform diagram of an operation of the circuit of FIG. 5.

Referring to FIG. 7, data "1" of a cell storage voltage is defined as SN(DATA1), and data "0" thereof is defined as SN(DATA0). The negative under-drive period of FIG. 6 corresponds to a negative under-drive region of FIG. 7. For example, the negative voltage VBB2 in this region may be about −0.4V. In this case, the output stage SL of the sense amplifier SA depends on the negative voltage VBB2.

Figure 8:
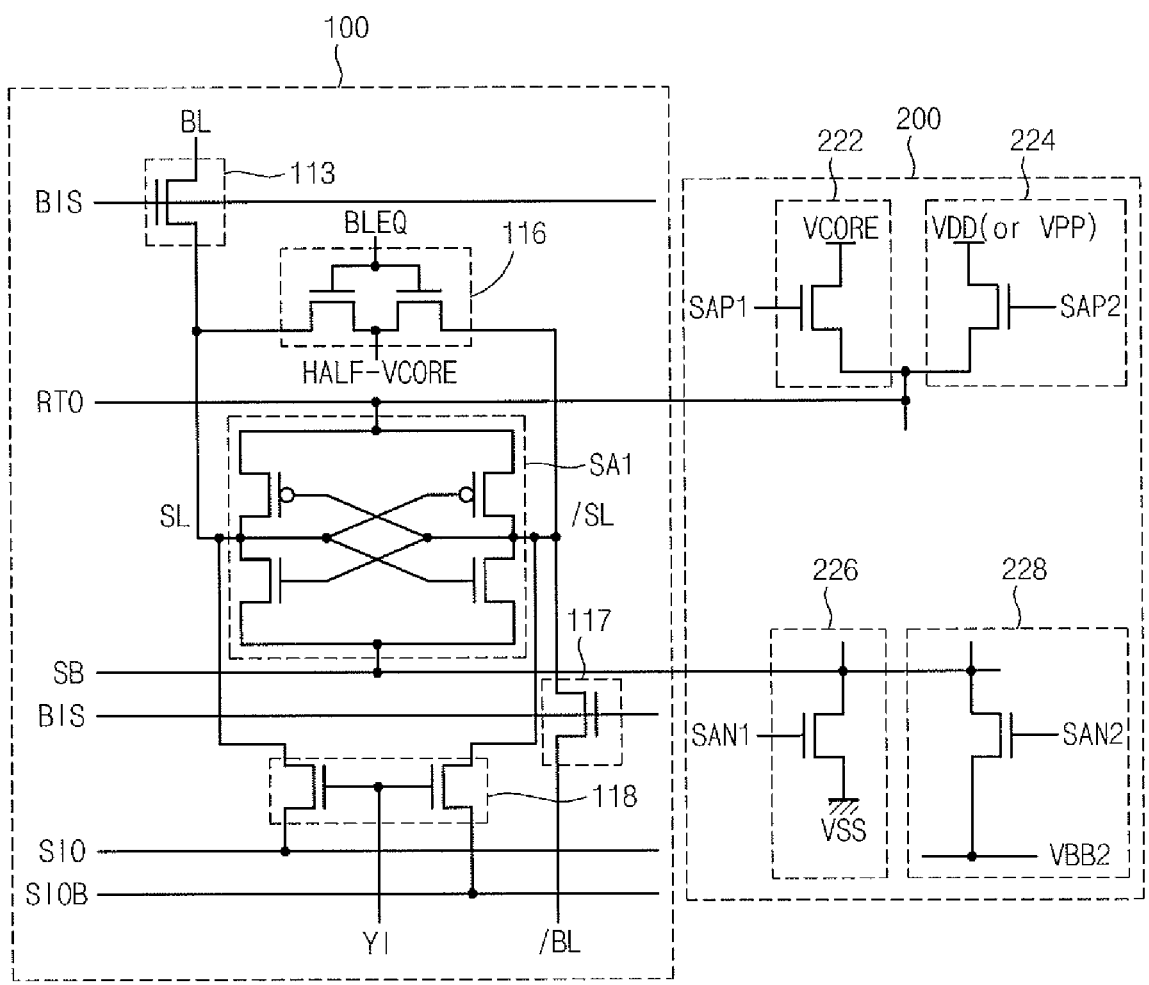
FIG. 8 is a circuit diagram of an opened bit line structure employed by a sense amplifier circuit in a semiconductor memory device according to an embodiment of the present invention.

Meanwhile, the present invention may also be applied to an opened bit line structure, which is exemplified in FIG. 8.

Referring to FIG. 8, a sense amplifier 100 is formed between bit lines BL and /BL. A drive controller 200 is formed to supply a pull-up voltage and a pull-down voltage to a sense amplifier SA1 of the sense amplifier 100.

A pre-charger 116 and the sense amplifier SA1 are formed in parallel between the bit lines BL and /BL. The pre-charger 116 and the sense amplifier SA1 are formed between a bit line selector 117 and another bit line selector 113. Input/output stages connected to the bit lines BL and /BL of the sense amplifier SA1 are respectively connected to input/output lines SI0 and SIOB via a selector 118.

The drive controller 200 includes a normal pull-up driver 222, an over-driver 224, a normal pull-down driver 226, and an under-driver 228. The normal pull-up driver 222 and the over-driver 224 are supplied with different voltages (i.e., a core voltage VCORE and a high voltage VDD or VPP) and are commonly connected to a pull-up voltage supply stage RTO of the sense amplifier SA1. The normal pull-down driver 222 and the under-driver 224 are supplied with different voltages (e.g., a ground voltage VSS and a back bias voltage VBB2) and are commonly connected to a pull-down voltage supply stage SB of the sense amplifier SA1.

The sense amplifier having the aforementioned structure allows the bit lines BL and /BL to be supplied with a voltage of VCOER/2 in response to an equalizing signal BLEQ for a pre-charge operation.

Data is input and output between the sense amplifier SA1 and the input/output lines SIO and SIOB in response to a column selection signal YI.

Data is exchanged through the bit lines BL and /BL between the sense amplifier SA1 and a cell array in response to a bit line selection signal BIS.

To achieve equalization between the bit lines BL and /BL, the equalizer 112 operates in response to the equalizing signal BLEQ.

In the drive controller 200, the normal pull-up driver 222 includes an NMOS transistor which provides the voltage VCORE that is a bit line high voltage for the use of a pull-up operation of the sense amplifier SA1. The pull-up driver 222 is driven in response to a normal pull-up control signal SAP1. The over-driver 224 includes an NMOS transistor which provides the high voltage VPP equal to or higher than the chip supply voltage VDD for the use of the pull-up operation of the sense amplifier SA1. For an over-drive, the over-driver 224 is driven in response to an over-drive control signal SAP2. The normal pull-down driver 226 includes an NMOS transistor which provides the ground voltage VSS to the bit lines. The normal pull-down driver 226 is driven in response to a normal pull-down control signal SAN1. For an under-drive, the under-driver 228 includes an NMOS transistor which provides the back bias voltage VBB2 that is a negative voltage. The under-driver 28 is driven in response to an under-drive control signal SAN2.

In the case where an under-drive method is employed in the opened bit line structure as described above with reference to FIG. 8, the sense amplifier SA1 operates in the same manner as in the embodiment shown in FIG. 5. Therefore, the same descriptions will be omitted.

In order to reduce deterioration of amplification features produced by a threshold voltage difference between an NMOS transistor and a PMOS transistor of a sense amplifier, the present invention operates as follows.

First, in an initial amplification step, driving capability of the NMOS transistor is improved by under-driving the source of the NMOS transistor at a negative voltage lower than a ground voltage in order to amplify a low voltage.

Second, after the low voltage is amplified by the NMOS transistor, a high voltage is amplified. In this case, the high voltage is over-driven by providing a voltage higher than a bit line drive voltage.

INDUSTRIAL APPLICABLILITY

According to the present invention, when a semiconductor memory device operates at a low voltage, driving capability of a sense amplifier can be compensated for.

In addition, by performing an under-drive, erroneous data is less produced when an over-drive is performed.

In addition, data can be read from or written in a cell at an improved speed when a cell voltage is sensed by the under-drive and the over-drive in comparison with the case where the cell voltage is sensed at a low voltage.

The invention claimed is:

1. A sense amplifier circuit in a semiconductor memory device, comprising:
    a sense amplifier which has a pull-down element composed of an NMOS transistor and a pull-up element composed of a PMOS transistor and is formed between bit lines to perform data exchange; and
    a drive controller which supplies a drive voltage for the use of pull-up and pull-down operations to the sense amplifier in order to perform the data exchange, and, during a specific time period included in a time for providing the drive voltage, performs an under-drive whereby the drive voltage for the use of the pull-down operation is used so that the sense amplifier is provided with a voltage that is lower than a voltage used in the pull-down operation in a normal state.

2. The sense amplifier circuit according to claim 1, wherein the drive controller performs the under-drive after the sense amplifier is connected to the bit lines.

3. The sense amplifier circuit according to claim 1, wherein, for the under-drive, the drive controller provides a voltage lower than a ground voltage.

4. The sense amplifier circuit according to claim 1, wherein, for the under-drive, the drive controller provides a negative voltage.

5. The sense amplifier circuit according to claim 1, wherein, for the under-drive, the drive controller provides a voltage lower than a ground voltage and higher than −5V.

6. The sense amplifier circuit according to claim 1, wherein, during another specific time period included in the time for providing the drive voltage, the drive controller performs an over-drive whereby the drive voltage for the use of the pull-up operation is used so that the sense amplifier is provided with a voltage that is higher than a voltage used in the pull-up operation in the normal state.

7. The sense amplifier circuit according to claim 6, wherein the drive controller provides a voltage equal to or higher than a chip supply voltage VDD in order to perform the over-drive.

8. The sense amplifier circuit according to claim 6, wherein the drive controller performs the over-drive after the under-drive is performed.

9. The sense amplifier circuit according to claim 8, wherein the drive controller concurrently performs the under-drive and the over-drive for a specific time period.

10. The sense amplifier circuit according to claim 6, wherein the drive controller further comprises:
    a normal pull-up driver which supplies a normal pull-up voltage to the sense amplifier in response to a normal pull-up control signal;
    a normal pull-down driver which supplies a normal pull-down voltage to the sense amplifier in response to a normal pull-down control signal; and
    an under-driver which supplies a voltage lower than the normal pull-down voltage to the sense amplifier in response to an under-drive control signal.

11. The sense amplifier circuit according to claim 10, further comprising an over-driver which supplies a voltage higher than the normal pull-up voltage to the sense amplifier in response to an over-drive control signal.

12. A sense amplifier circuit in a semiconductor memory device, comprising:
    bit lines connected to a cell;
    a sense amplifier which has a pull-down element composed of an NMOS transistor and a pull-up element composed of a PMOS transistor and is formed between the bit lines to perform data exchange;

a bit line selector which determines the connection between the sense amplifier and the bit lines in order to perform the data exchange; and a drive controller which supplies a drive voltage for the use of pull-up and pull-down operations to the sense amplifier in order to perform the data exchange, and, during a specific time period included in a time for providing the drive voltage, performs an under-drive whereby the drive voltage for the use of the pull-down operation is used so that the sense amplifier is provided with a voltage that is lower than a voltage used in the pull-down operation in a normal state.

13. The sense amplifier circuit according to claim 12, wherein the drive controller performs the under-drive after the sense amplifier is connected to the bit lines.

14. The sense amplifier circuit according to claim 12, wherein, for the under-drive, the drive controller provides a voltage lower than a ground voltage.

15. The sense amplifier circuit according to claim 12, wherein, for the under-drive, the drive controller provides a negative voltage.

16. The sense amplifier circuit according to claim 12, wherein, for the under-drive, the drive controller provides a voltage lower than a ground voltage and higher than −5V.

17. The sense amplifier circuit according to claim 12, wherein, during another specific time period included in the time for providing the drive voltage, the drive controller performs an over-drive whereby the drive voltage for the use of the pull-up operation is used so that the sense amplifier is provided with a voltage that is higher than a voltage used in the pull-up operation in the normal state.

18. The sense amplifier circuit according to claim 17, wherein the drive controller provides a voltage equal to or higher than a chip supply voltage VDD in order to perform the over-drive.

19. The sense amplifier circuit according to claim 17, wherein the drive controller performs the over-drive after the under-drive is performed.

20. The sense amplifier circuit according to claim 19, wherein the drive controller concurrently performs the under-drive and the over-drive for a specific time period.

21. The sense amplifier circuit according to claim 12, wherein the drive controller further comprises:

a normal pull-up driver which supplies a normal pull-up voltage to the sense amplifier in response to a normal pull-up control signal;

a normal pull-down driver which supplies a normal pull-down voltage to the sense amplifier in response to a normal pull-down control signal; and an under-driver which supplies a voltage lower than the normal pull-down voltage to the sense amplifier in response to an under-drive control signal.

22. The sense amplifier circuit according to claim 21, further comprising an over-driver which supplies a voltage higher than the normal pull-up voltage to the sense amplifier in response to an over-drive control signal.

23. The sense amplifier circuit according to claim 12, wherein the bit lines have a folded bit line structure.

24. The sense amplifier circuit according to claim 12, wherein the bit lines have an opened bit line structure.

25. A driving method of a sense amplifier circuit in a semiconductor memory device, comprising:

a first step of connecting bit lines and a sense amplifier after the bit lines are pre-charged;

a second step of performing an under-drive by supplying a voltage which is lower than a voltage used in the pull-down operation in a normal state to a pull-down drive stage of an NMOS transistor included in the sense amplifier;

a third step of performing an over-drive by supplying a voltage which is higher than a voltage used in the pull-up operation in the normal state to a pull-up drive stage of a PMOS transistor included in the sense amplifier after the under-drive is initially performed;

a fourth step of performing a pull-down operation by supplying the voltage used in the pull-down operation in the normal state to the pull-down drive stage of the NMOS transistor included in the sense amplifier after the under-drive is completed; and a fifth step of performing a pull-up operation by supplying the voltage used in the pull-up operation in the normal state to the pull-up drive stage of the PMOS transistor included in the sense amplifier after the over-drive is completed.

26. The driving method of claim 25, wherein the under-drive is performed at voltage lower than a ground voltage.

27. The driving method of claim 25, wherein the under-drive is performed at a negative voltage.

28. The driving method of claim 25, wherein the under-drive is performed at a voltage lower than a ground voltage and higher than −5V.

29. The driving method of claim 25, wherein the over-drive is performed at a voltage equal to or higher than a chip supply voltage VDD.

30. The driving method of claim 25, wherein the under-drive and the over-drive are concurrently performed for a specific time period.

31. The driving method of claim 30, wherein the under-drive is performed before the over-drive is completed.

32. The driving method of claim 25, wherein the under-drive is completed before the pull-up operation is initially performed in the normal state.

* * * * *